US012588153B2

(12) United States Patent
    Iwaki

(10) Patent No.: US 12,588,153 B2
(45) Date of Patent: Mar. 24, 2026

(54) ELECTRONIC EQUIPMENT SEALING STRUCTURE AND METHOD FOR MANUFACTURING THE SAME

(71) Applicant: MEKTEC CORPORATION, Tokyo (JP)

(72) Inventor: Hirokazu Iwaki, Tokyo (JP)

(73) Assignee: MEKTEC CORPORATION, Tokyo (JP)

( * ) Notice: Subject to any disclaimer, the term of this patent is extended or adjusted under 35 U.S.C. 154(b) by 303 days.

(21) Appl. No.: 18/510,566

(22) Filed: Nov. 15, 2023

(65) Prior Publication Data

US 2024/0206082 A1      Jun. 20, 2024

(30) Foreign Application Priority Data

Dec. 15, 2022    (JP) ................................. 2022-200117

(51) Int. Cl.
    *H05K 5/00*          (2025.01)
(52) U.S. Cl.
    CPC ................................... *H05K 5/0026* (2013.01)
(58) Field of Classification Search
    CPC ................................................... H05K 5/0026
    See application file for complete search history.

(56) References Cited

U.S. PATENT DOCUMENTS

| 6,064,003 A * | 5/2000 | Moore | ................ B60R 16/0222 |
| | | | 174/152 G |
| 8,178,794 B2 * | 5/2012 | Hayashi | ............... H05K 1/0281 |
| | | | 174/60 |
| 2011/0181003 A1 | 7/2011 | Hayashi et al. | |

FOREIGN PATENT DOCUMENTS

JP            5354281 B2      11/2013

* cited by examiner

*Primary Examiner* — Pete T Lee
(74) *Attorney, Agent, or Firm* — Studebaker Brackett PLLC

(57)          ABSTRACT

Provided is an electronic equipment sealing structure that includes a case, a flexible printed circuit board, and an adhesive layer, in which the case includes a case body, an opening provided in the case body, and a pair of thin plate portions having flexibility; part of the flexible printed circuit board is inserted into the case body through the opening; one thin plate portion and the other thin plate portion of the pair of thin plate portions are provided along the opening so as to face each of first and second surfaces of the flexible printed circuit board; and the adhesive layer is provided so as to close a clearance between an inner wall surface of the opening and the flexible printed circuit board.

8 Claims, 6 Drawing Sheets

ELECTRONIC EQUIPMENT SEALING STRUCTURE AND METHOD FOR MANUFACTURING THE SAME

CROSS-REFERENCE TO RELATED APPLICATION

This application claims priority from Japanese Patent Application No. 2022-200117 filed with the Japan Patent Office on Dec. 15, 2022, the entire content of which is hereby incorporated by reference.

BACKGROUND

1. Technical Field

The present disclosure relates to an electronic equipment sealing structure and a method for manufacturing the sealing structure.

2. Related Art

For various types of electronic equipment, a flexible printed circuit board (hereinafter referred to as an FPC) has been broadly used for electrically connecting a plurality of electronic components provided in a case to a power source and an external device outside the case. The FPC utilized as above is used with part of the FPC drawn out of the case through an opening provided in the case. With this configuration, a plurality of lines provided on the FPC are connected, on one end side, to the plurality of electronic components in the case, and are connected, on the other end side, to the power source and various devices outside the case.

In this electronic equipment, a seal that closes a clearance between the opening of the case and the FPC in order to prevent entrance of, e.g., water or dust into the case is provided in some cases. For example, an electronic equipment sealing structure is provided in such a manner that a grommet formed of an elastic body such as rubber is provided integrally with the FPC (see Japanese Patent No. 5354281) or the above-described clearance is filled with liquid rubber.

However, in the case of the structure provided with the grommet, the stiffness of the case needs to be increased, and the thickness of the case needs to be increased in order to fit the grommet. In the case of the structure in which the clearance is filled with the liquid rubber, a structure (e.g., a groove is provided in the case) for filling the clearance with the liquid rubber needs to be provided in order to allow filling the clearance with the liquid rubber, and it is difficult to reduce a cost due to complicated manufacturing steps. As described above, there is still room for improvement in the typical electronic equipment sealing structure.

SUMMARY

An electronic equipment sealing structure according to an embodiment of the present disclosure includes a case, a flexible printed circuit board, and an adhesive layer, and is so configured that the case includes a case body, an opening provided in the case body, and a pair of thin plate portions having flexibility; part of the flexible printed circuit board is inserted into the case body through the opening; one thin plate portion and the other thin plate portion of the pair of thin plate portions are provided along the opening so as to face first and second surfaces of the flexible printed circuit board; and the adhesive layer is provided so as to close a clearance between an inner wall surface of the opening and the flexible printed circuit board.

DETAILED DESCRIPTION

Figure 1A:
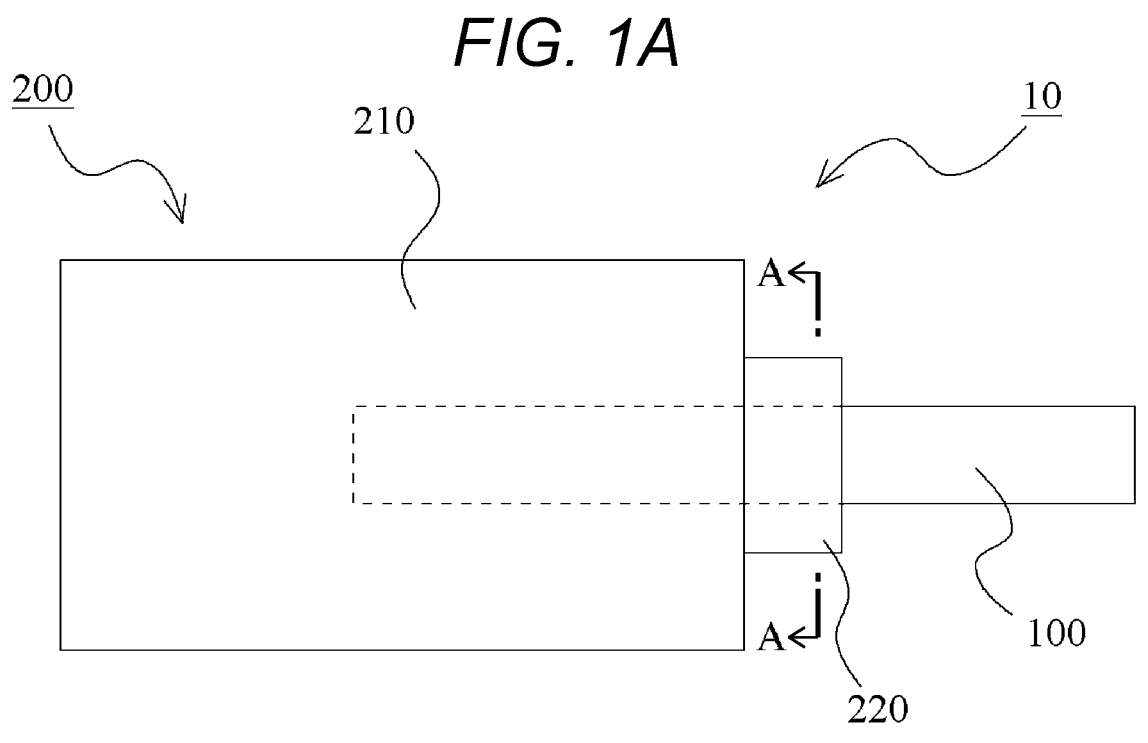
FIGS. 1A and 1B are schematic configuration views of a device having an electronic equipment sealing structure according to a first embodiment of the present disclosure.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

One object of the present disclosure is to provide an electronic equipment sealing structure capable of obtaining sufficient sealability with a simple structure and a method for manufacturing the sealing structure.

The present disclosure employs the following techniques in order to solve the above-described problems.

An electronic equipment sealing structure of the present disclosure includes a case, a flexible printed circuit board, and an adhesive layer, in which the case includes a case body, an opening provided in the case body, and a pair of thin plate portions having flexibility; part of the flexible printed circuit board is inserted into the case body through the opening; one thin plate portion and the other thin plate portion of the pair of thin plate portions are provided along the opening so as to face first and second surfaces of the flexible printed circuit board; and the adhesive layer is provided so as to close a clearance between an inner wall surface of the opening and the flexible printed circuit board.

According to the present disclosure, the case is provided with the pair of thin plate portions, and the adhesive layer is provided inside the pair of thin plate portions. With this configuration, the electronic equipment sealing structure can be obtained. Moreover, the flexible printed circuit board is sandwiched by the pair of thin plate portions so that the clearance between the flexible printed circuit board and the thin plate portions can be closed. Thus, the structure in which the adhesive layer is provided in the narrow clearance between the flexible printed circuit board and the thin plate portions is provided so that a space can be saved. Accordingly, sealability is also improved.

The flexible printed circuit board may include a base film, a line provided on the base film, and a cover film adhered to the base film so as to cover the line, and a width of the base film and a width of the cover film may be different from each other.

With this configuration, steps are formed on side surfaces of the flexible printed circuit board, and therefore, it is possible to reduce generation of a portion not filled with the adhesive layer in the vicinity of the center of the flexible printed circuit board in the thickness direction thereof on the side surface sides of the flexible printed circuit board.

The line and the cover film may be provided on each of first and second surface sides of the base film.

The electronic equipment sealing structure may further include a supplemental adhesive layer, and the supplemental adhesive layer may be provided inside the adhesive layer so as to cover each of the first and second surfaces of the flexible printed circuit board and protrude from each side surface of the flexible printed circuit board in a short-side direction of the flexible printed circuit board.

The supplemental adhesive layer is provided as described above, and therefore, it is possible to reduce generation of a portion not filled with the adhesive layer in the vicinity of the center of the flexible printed circuit board in the thickness direction thereof on the side surface sides of the flexible printed circuit board.

A method for manufacturing an electronic equipment sealing structure of the present disclosure includes providing an opening in a case; providing a pair of thin plate portions having flexibility along the opening such that one thin plate portion and the other thin plate portion of the pair of thin plate portions face each of first and second surfaces of a flexible printed circuit board to be inserted into the case through the opening; providing an adhesive layer on each of inner surfaces of the one thin plate portion and the other thin plate portion; inserting part of the flexible printed circuit board into the case through the opening; and performing adhering with the adhesive layer.

As described above, the electronic equipment sealing structure can be obtained by only providing the adhesive layer inside the pair of thin plate portions having the flexibility and performing adhering with the adhesive layer after the flexible printed circuit board has been arranged.

The flexible printed circuit board may include a base film, a line provided on the base film, and a cover film adhered to the base film so as to cover the line, and a width of the base film and a width of the cover film may be different from each other.

It is preferred that the line and the cover film are provided on each of first and second surface sides of the base film.

The method for manufacturing the electronic equipment sealing structure may further include before the inserting the part of the flexible printed circuit board into the case through the opening, providing a supplemental adhesive layer such that the supplemental adhesive layer covers the first and second surfaces of the flexible printed circuit board and protrudes from each side surface of the flexible printed circuit board in a short-side direction of the flexible printed circuit board.

Note that the above-described configurations may be employed in combination to the extent possible.

As described above, according to the electronic equipment sealing structure of the present disclosure, sufficient sealability can be obtained with a simple structure.

Hereinafter, exemplary embodiments of the present disclosure will be described in detail with reference to the drawings. Note that unless otherwise specified, the technical scope of the present disclosure is not limited to the dimensions, materials, shapes, relative arrangements, etc. of components described in the embodiments.

First Embodiment

Figure 1B:
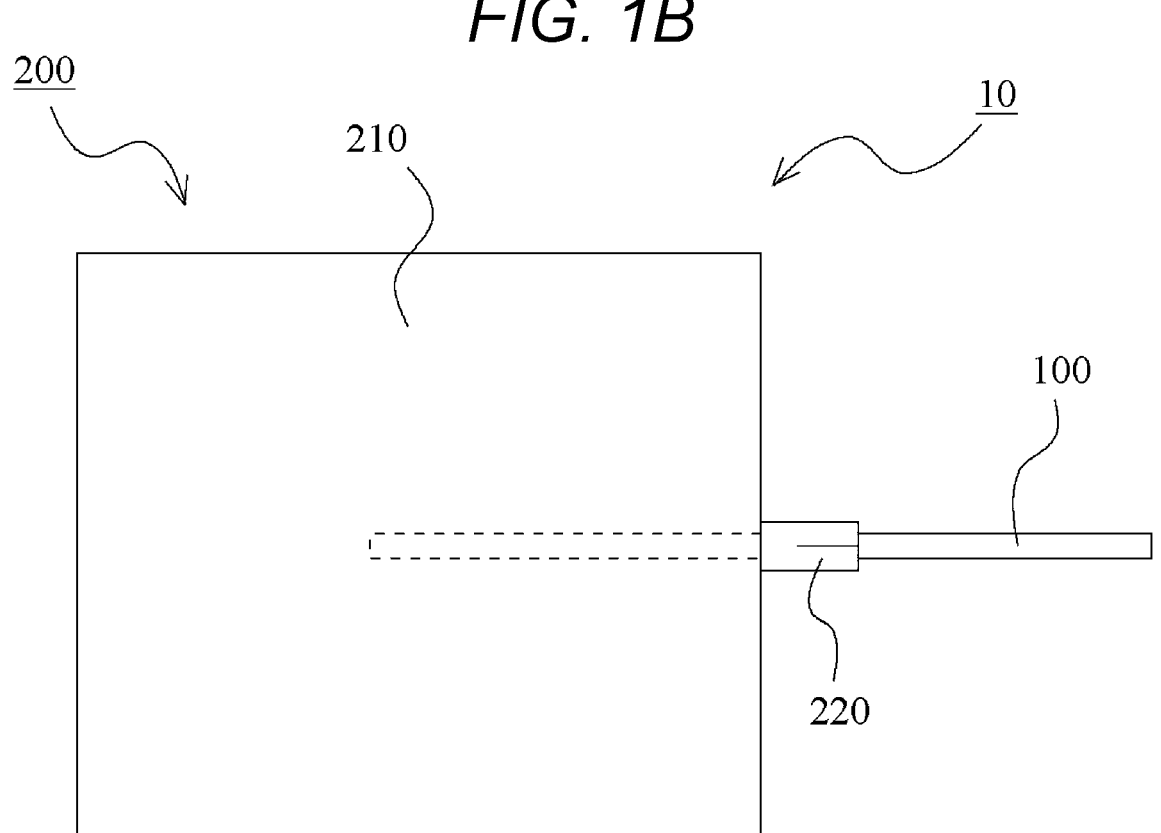
Figure 2A:
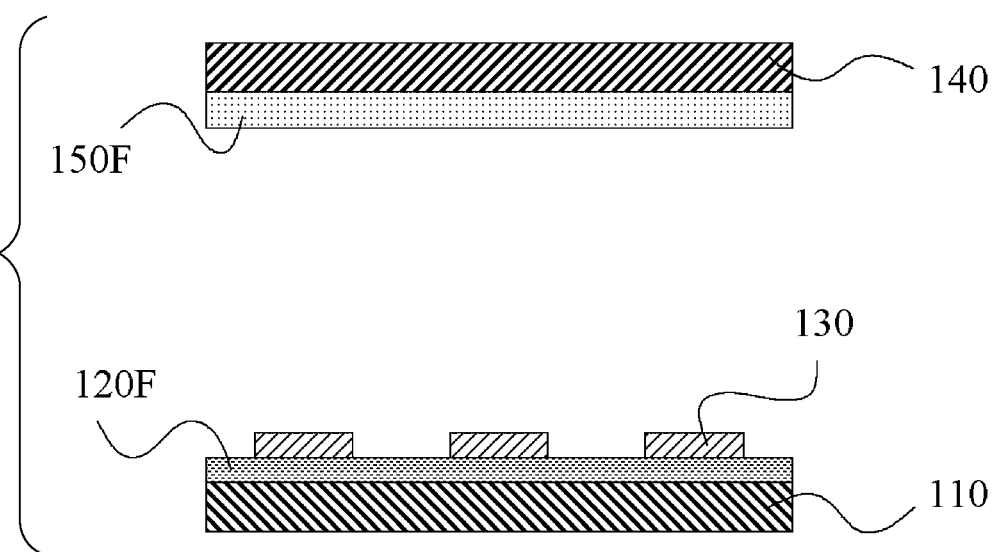
FIGS. 2A and 2B are views of steps of manufacturing a flexible printed circuit board according to the first embodiment of the present disclosure.
Figure 2B:
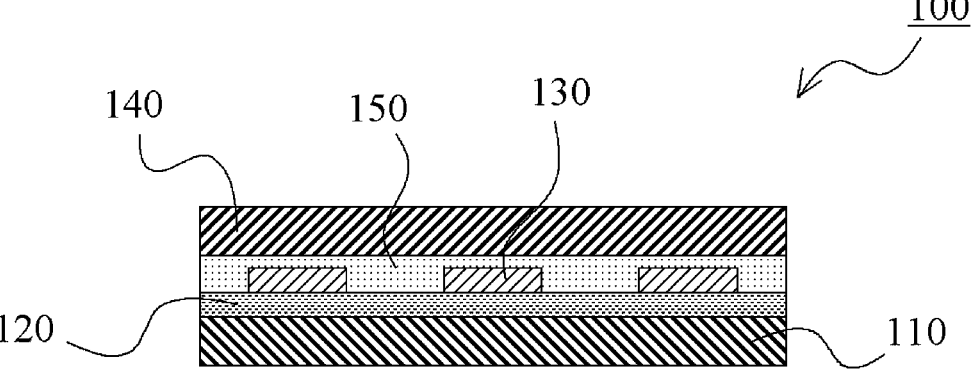
Figure 3A:
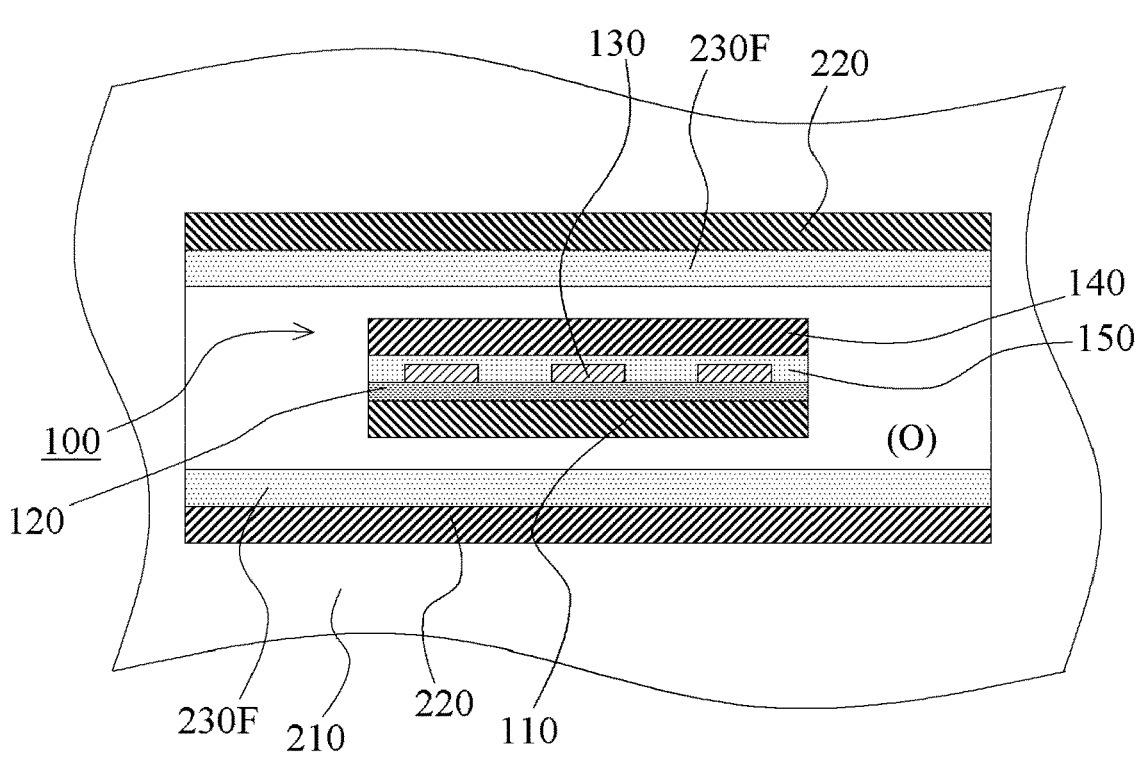
FIGS. 3A and 3B are views of steps of manufacturing the electronic equipment sealing structure according to the first embodiment of the present disclosure.
Figure 3B:
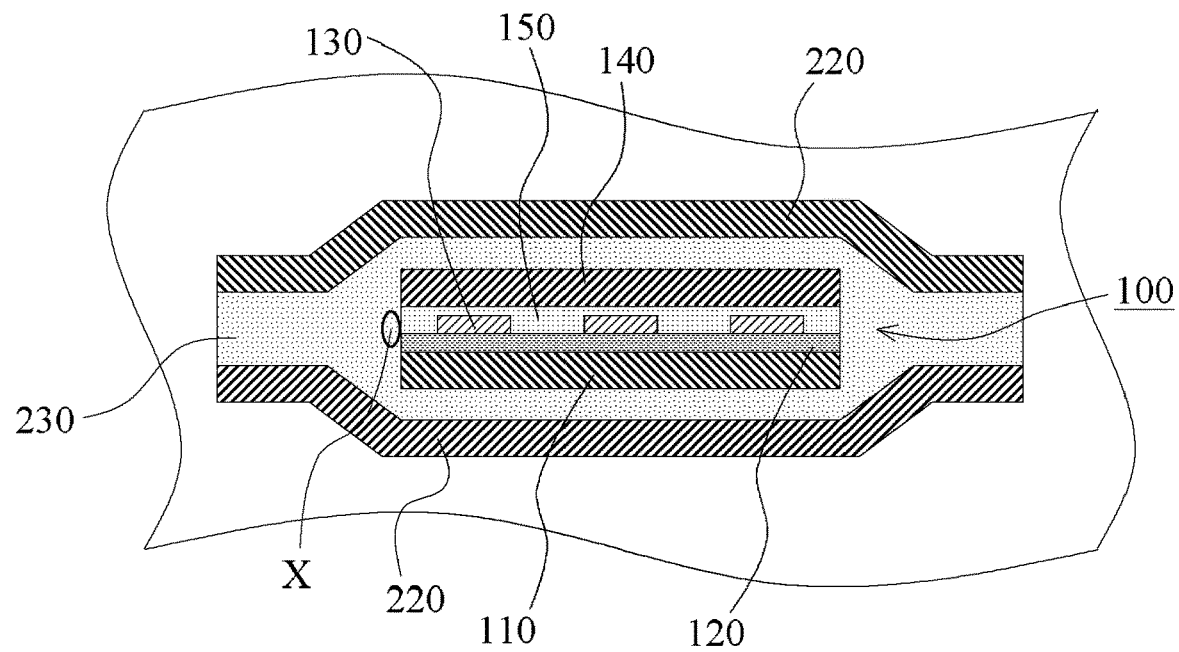

A sealing structure for electronic equipment having a flexible printed circuit board (hereinafter referred to as an FPC) according to a first embodiment of the present disclosure and a method for manufacturing the sealing structure will be described with reference to FIGS. 1A to 3B. FIGS. 1A and 1B are schematic configuration views of a device (electronic equipment) having the electronic equipment sealing structure according to the first embodiment of the present disclosure, FIG. 1A showing a plan view and FIG. 1B showing a side view. FIGS. 2A and 2B are views of steps of manufacturing the FPC according to the first embodiment of the present disclosure. Note that FIGS. 2A and 2B show each member by schematic sectional views (equivalent to sectional views along an AA line in FIG. 1A). FIGS. 3A and 3B are views of steps of manufacturing the electronic equipment sealing structure according to the first embodiment of the present disclosure. Note that FIGS. 3A and 3B show each member by schematic sectional views (equivalent to sectional views along the AA line in FIG. 1A). In each figure, an adhesive layer is assigned with "F" subsequent to a number as a reference numeral for an adhesive layer before adhering, and is assigned only with a number as a reference numeral for an adhesive layer after adhering (adhesive layer cured after melted).

<Device Having Sealing Structure>

A device 10 shown in FIGS. 1A and 1B includes an FPC 100 and a case 200. Various types of electronic equipment are applicable to the device 10 according to the present embodiment, and the case 200 includes a plurality of electronic components. The case 200 integrally includes a case body 210 and a pair of thin plate portions 220 having flexibility. Depending on the device 10, the case body 210 may be made of a material having a high stiffness, or may be made of a material having a high flexibility as in the thin plate portion 220. In a case where the case body 210 and the pair of thin plate portions 220 are different in material from each other, the case body 210 and the pair of thin plate portions 220 may be separately molded, and thereafter, may be joined to each other. Alternatively, the case body 210 and the pair of thin plate portions 220 may be simultaneously molded by integral molding. In a case where the material of the case body 210 and the material of the pair of thin plate portions 220 are the same as each other, these portions are preferably integrally molded.

As shown in FIG. 3A, the case body 210 is provided with an opening O. In the present embodiment, the opening O is provided in one side surface (right side surface in the plan view of FIG. 1A) parallel with the short-side direction of the case 200.

The FPC 100 is used with part of the FPC 100 drawn out of the case 200 through the opening O. In other words, the FPC 100 is used with part of the FPC 100 inserted into the case 200 from the outside. With this configuration, a plurality of lines 130 provided in the FPC 100 can be connected, on one end side, to various electronic components (not shown) in the case 200, and can be connected, on the other end side, to a power source and various devices (not shown) outside the case 200. One thin plate portion 220 and the other thin plate portion 220 of the pair of thin plate portions 220 having the flexibility are provided along the opening O in the case body 210 so as to face each of first and second surfaces of the FPC 100.

In the present embodiment, the length of the pair of thin plate portions 220 in a width direction (length in an upper-lower direction in the plan view of FIG. 1A) is greater than the length of the FPC 100 in the width direction. In the example shown in FIGS. 1B to 3B, the pair of thin plate portions 220 extends outward of the case 200 from an opening end of the opening O of the case body 210. Specifically, the one thin plate portion 220 and the other thin plate portion 220 extend outward of the case 200 from an upper opening end and a lower opening end of the opening O.

Note that in description below, the one thin plate portion 220 and the other thin plate portion 220 of the pair of thin plate portions 220 will be referred to as one and the other thin plate portions 220 in some cases.

<Sealing Structure for Electronic Equipment Having FPC and Method for Manufacturing Sealing Structure>

A method for manufacturing the FPC 100 is a well-known technique, and therefore, a representative manufacturing method will be briefly described with reference to FIGS. 2A and 2B. First, etching is performed on a material including metal foil (e.g., copper foil) on a base film 110 through an adhesive layer 120F, thereby providing a desired circuit (lines 130). In this manner, the plurality of lines 130 are formed on the base film 110 (see FIG. 2A). A cover film 140 (see FIG. 2A) provided with an adhesive layer 150F on one surface is stacked on and adhered to the base film 110 obtained as described above (see FIG. 2B). Note that the adhesive layer 120F and the adhesive layer 150F are made of thermosetting resin materials and are cured after melted by heating under pressure in a state of the cover film 140 being stacked on the base film 110. In this manner, the base film 110 and the cover film 140 are fixed to each other with the cured adhesive layer 120 and adhesive layer 150. Moreover, the plurality of lines 130 are in a state of being sandwiched by the base film 110 and the cover film 140, and are protected from the outside.

As described above, the case 200 is provided with the pair of thin plate portions 220. Moreover, as shown in FIG. 3A, adhesive layers 230F are each provided on the inner surfaces of the one thin plate portion 220 and the other thin plate portion 220 of the pair of thin plate portions 220. For example, the adhesive layer 230F may be formed of a thermosetting resin film. In this case, the film-shaped adhesive layers 230F may be each adhered to the inner surfaces of the one thin plate portion 220 and the other thin plate portion 220 of the pair of thin plate portions 220.

Next, the FPC 100 is arranged in the case 200. Accordingly, part of the FPC 100 is drawn out of the case 200 through the opening O (see FIGS. 1A and 1B). Thereafter, adhering is performed with the adhesive layers 230F (see FIG. 3A) provided on the inner surfaces of the one thin plate portion 220 and the other thin plate portion 220 of the pair of thin plate portions 220. In a case where the adhesive layer 230F is formed of the thermosetting resin film as described above, the pair of adhesive layers 230F is cured after melted by heating under pressure in a state of the pair of thin plate portions 220 being stacked on each other, and in this manner, the pair of thin plate portions 220 is made adhered to each other.

In the above-described manner, a clearance between the inner wall surface of the opening O provided in the case 200 and the FPC 100 is in a state of being filled with the cured adhesive layer 230, and therefore, the clearance is closed (see FIG. 3B). That is, the cured adhesive layer 230 functions as a seal for closing the above-described clearance.

Note that for the pair of thin plate portions 220, it is desired to employ a configuration in which part of the one thin plate portion 220 and part of the other thin plate portion 220 are connected to each other in the vicinity of the base (base end side) on the case body 210 side and the one thin plate portion 220 and the other thin plate portion 220 are separated from each other on the tip end side extending outward of the case body 210 (see FIG. 1B). Since the tip end side of the one thin plate portion 220 and the tip end side of the other thin plate portion 220 are separated from each other, the one thin plate portion 220 and the other thin plate portion 220 can be opened in a direction of the one thin plate portion 220 and the other thin plate portion 220 being separated from each other when a process of inserting the FPC 100 into the opening O is performed, and therefore, the process of inserting the FPC 100 can be facilitated. Moreover, since the adhesive layers 230F are provided to the base position of the pair of thin plate portions 220, at which part of the one thin plate portion 220 and part of the other thin plate portion 220 are connected to each other, the clearance between the inner wall surface of the opening O and the FPC 100 can be more reliably filled with the cured adhesive layer 230.

In a case where part of the one thin plate portion 220 and part of the other thin plate portion 220 are connected to each other on the base end side, both right and left end portions of the one thin plate portion 220 and the other thin plate portion 220 in FIG. 3A may be connected to each other, for example. With this configuration, closing of the opening O with the pair of thin plate portions 220 can be prevented.

As described above, in the present embodiment, the adhesive layers 230F are provided in advance on the inner surfaces of the pair of thin plate portions 220 before the FPC 100 is arranged. The adhesive layers 230F are cured after melted in a state of the FPC 100 being arranged, and in this manner, adhering is performed with the cured adhesive layer 230. In this manner, the clearance between the opening O (specifically, inner wall surface of the opening O) provided in the case 200 and the FPC 100 is closed.

Note that the present embodiment has described the configuration in which adhering is performed with the adhesive layers 230F after the FPC 100 has been arranged in the formed case body 210. However, the present disclosure also includes a configuration in a case of performing, as the same step, formation of the case 200 and adhering with the adhesive layers 230F. For example, in a case where the case 200 includes a plurality of members (e.g., film-shaped members) having flexibility and these members are adhered (e.g., heat-sealed) with an adhesive to form the case 200, formation of the case 200 and adhering with the adhesive layers 230F for providing the sealing structure can be performed as the same step. That is, the adhesive layer 230F for forming the case 200 and the adhesive layer 230F for providing the sealing structure are provided for the plurality of members, and adhering such as heat-sealing is performed with the adhesive layers on each member after the FPC has been arranged so as to pass through a position to be the opening O of the case 200 from the inside of the case 200. In this manner, the sealing structure can be provided by the same step as that for formation of the case 200. Note that in a case of employing such a configuration, a boundary between the case body 210 and the pair of thin plate portions 220 is not always clearly recognizable.

<Advantages of Electronic Equipment Sealing Structure According to Present Embodiment and Method for Manufacturing Sealing Structure>

According to the electronic equipment sealing structure of the present embodiment, the sealed structure can be obtained only by the structure provided with the pair of thin plate portions 220 in the case 200 and provided with the adhesive layers 230F inside the pair of thin plate portions 220. Moreover, according to the manufacturing method of the present embodiment, the adhesive layers 230F are provided inside the pair of thin plate portions 220 having the flexibility, and the electronic equipment sealing structure can be obtained only by performing adhering with the adhesive layers 230F after the FPC 100 has been arranged.

According to the present embodiment, the clearance between the FPC 100 and the thin plate portions 220 can be closed by sandwiching the FPC 100 by the pair of thin plate portions 220. The electronic equipment sealing structure according to the present embodiment has the structure in which the cured adhesive layer 230 is provided in the narrow clearance between the FPC 100 and the thin plate portions 220 as described above, and therefore, space saving can be achieved. Accordingly, sealability is also improved.

As described above, the electronic equipment sealing structure according to the present embodiment can prevent, e.g., water and dust from entering into the case 200. For example, there is a probability that in-vehicle electronic equipment is exposed to exhaust gas (e.g., $H_2S$ or $SO_2$) discharged from an engine room, gas generated from an EV system battery, and water vapor having a salt content in an area near a coast. For this reason, there is also a demand for prevention of entrance of the above-described exhaust gas etc. into the case 200. Since the electronic equipment sealing structure according to the present embodiment is the structure in which the cured adhesive layer 230 is provided in the narrow clearance between the FPC 100 and the thin plate portions 220, an effect of preventing entrance of the above-described exhaust gas etc. is higher as compared to an electronic equipment sealing structure using, e.g., a grommet. Note that in order to further prevent entrance of the above-described exhaust gas etc., a resin material such as olefin-based, fluorine-based, and phenol-based materials having excellent chemical resistance and solvent resistance is preferably employed as the material of the adhesive layer 230F. The material of the adhesive layer 230F may be selected as necessary according to use environment of the device (electronic equipment).

In the shown example, the case where the FPC 100 includes the lines 130 and the cover film 140 only on one surface side of the base film 110 (so-called single-sided FPC) has been described. However, the electronic equipment sealing structure according to the present embodiment and the method for manufacturing the sealing structure are also applicable to a configuration in which lines 130 and cover films 140 are provided on both surfaces (first and second surfaces of a base film 110) of the base film 110 (so-called double-sided FPC) and an FPC having a multi-layer structure in which films and lines are provided over many layers.

Depending on the entire thickness of the FPC 100 or the material or thickness of the adhesive layer 230F, there is a probability that the clearance between the inner wall surface of the opening O and the FPC 100 is not fully filled with the adhesive layer 230. For example, in a case where the adhesive layer 230F is formed of a thermosetting resin film as described above, the pair of adhesive layers 230F is heated under pressure in a state of the pair of thin plate portions 220 being stacked on each other, and in this manner, the pair of adhesive layers 230F flows to fill the clearance while being melted. The vicinity of a portion indicated by X in FIG. 3B is at a position apart from the pair of thin plate portions 220, and for this reason, there is a probability that the material of the molten adhesive layers 230F does not reach such a position and a void space is partially formed. Thus, in the following second and third embodiments, electronic equipment sealing structures with measures against such a defect will be described.

Second Embodiment

Figure 4A:
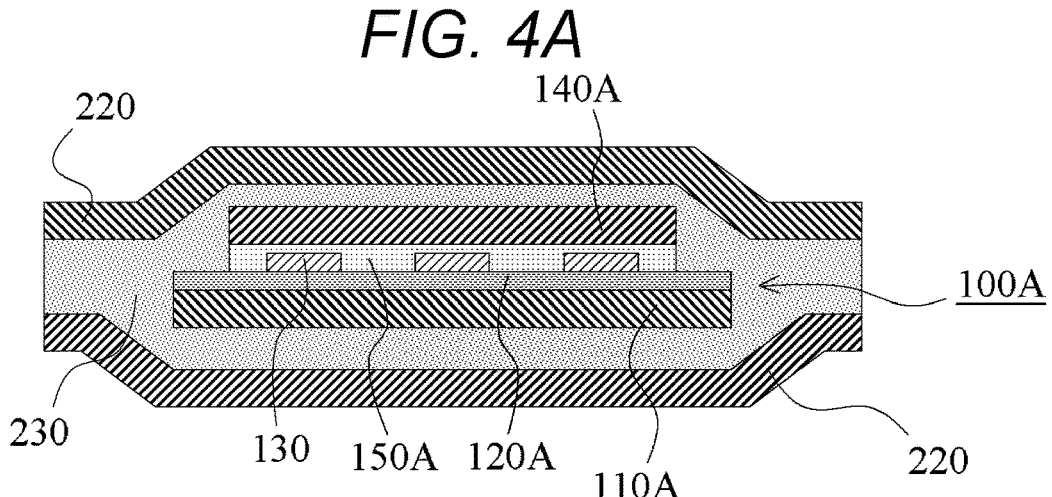
FIGS. 4A to 4C are schematic sectional views of an electronic equipment sealing structure according to a second embodiment of the present disclosure.
Figure 4B:
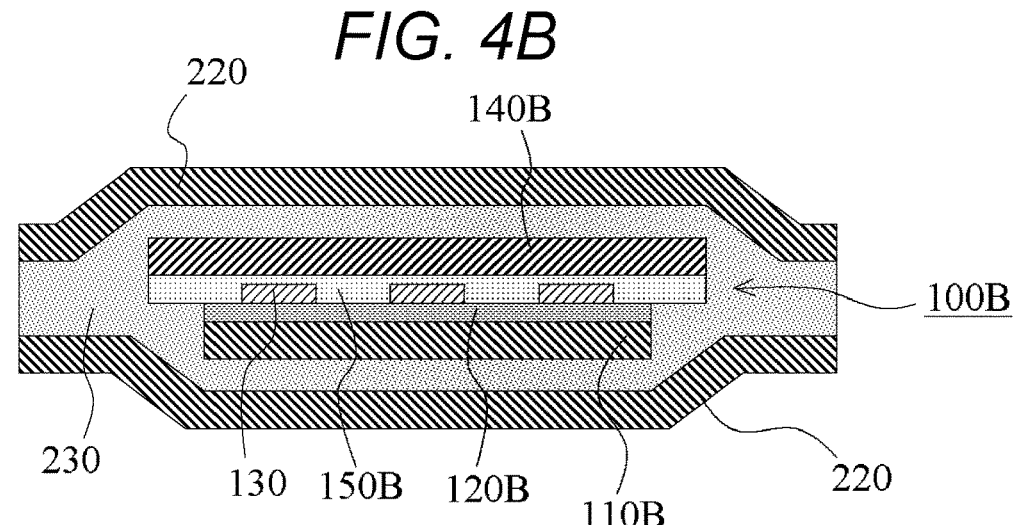
Figure 4C:
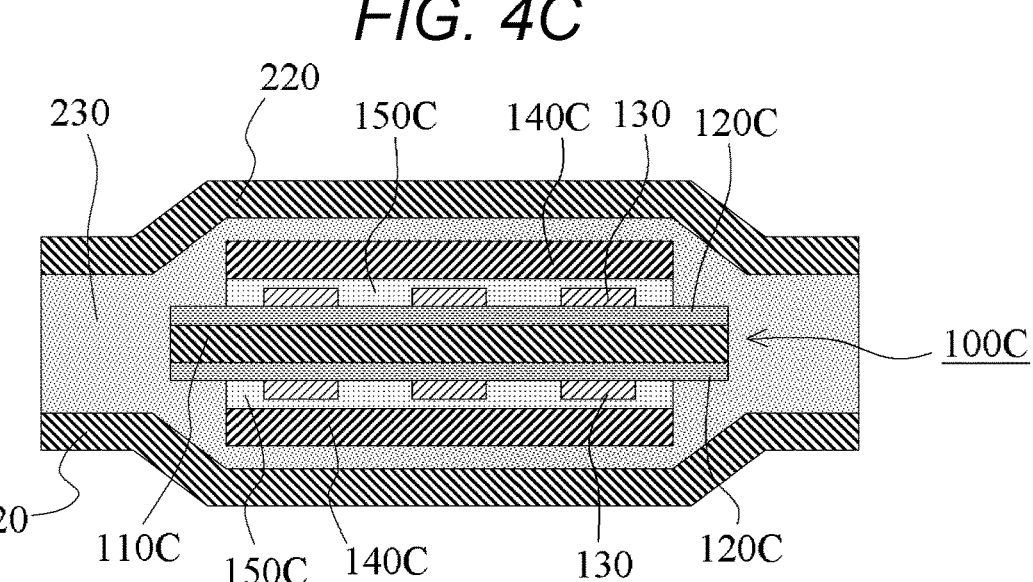

FIGS. 4A to 4C show the second embodiment of the present disclosure. In the present embodiment, a configuration different from that of the first embodiment in an FPC configuration will be described. Other configurations and features are the same as those of the first embodiment, and therefore, the same reference numerals are used to represent the same components and description thereof will be omitted as necessary.

The first embodiment has described the case where the FPC 100 configured such that the widths of the base film 110 and the cover film 140 in the short-side direction are the same as each other is employed as in a general FPC configuration. On the other hand, the present embodiment will describe a configuration in a case where an FPC configured such that the widths of a base film and a cover film in a short-side direction are different from each other at least in a region where adhering is performed with an adhesive layer 230 is employed. Note that the widths of the base film and the cover film in the short-side direction may be the same as each other in a region other than the region where adhering is performed with adhesive layers 230F.

FIGS. 4A to 4C are schematic sectional views of an electronic equipment sealing structure according to the second embodiment of the present disclosure, and are equivalent to sectional views along the AA line in FIG. 1A as described in the first embodiment. An FPC 100A shown in FIG. 4A is configured such that at least in the region where adhering is performed with the adhesive layer 230, the widths of a base film 110A and an adhesive layer 120A in the short-side direction are greater than the widths of a cover film 140A and an adhesive layer 150A in the short-side direction. Accordingly, steps are formed on both side surfaces of the FPC 100A. Thus, in a step of performing adhering with the adhesive layers 230F, a portion where a pair of thin plate portions 220 is bent is different between the base film 110A side and the cover film 140A side. Consequently, a distance to a portion where a distance from the pair of thin plate portions 220 to the FPC 100A is the longest can be shorter as compared to the first embodiment. With the above-described configuration, a clearance between the inner wall surface of an opening O and the FPC 100A can be fully filled with the adhesive layer 230, and generation of a void space can be reduced.

Note that a method for manufacturing the FPC 100A and a method for manufacturing a sealing structure for electronic equipment including the FPC 100A are similar to those of the first embodiment, and therefore, description thereof will be omitted.

An FPC 100B shown in FIG. 4B is configured such that at least in the region where adhering is performed with the adhesive layer 230, the widths of a base film 110B and an adhesive layer 120B in the short-side direction are less than the widths of a cover film 140B and an adhesive layer 150B in the short-side direction. Accordingly, steps are formed on both side surfaces of the FPC 100B. Thus, effects similar to those of the FPC 100A shown in FIG. 4A are obtained. Note that a method for manufacturing the FPC 100B and a method for manufacturing a sealing structure for electronic equipment including the FPC 100B are similar to those of the first embodiment, and therefore, description thereof will be omitted.

An FPC 100C shown in FIG. 4C is a so-called double-sided FPC. The FPC 100C is configured such that at least in the region where adhering is performed with the adhesive layer 230, the widths of a base film 110C and an adhesive layer 120C in the short-side direction are greater than the widths of a cover film 140C and an adhesive layer 150C, which are provided on each side, in the short-side direction. Accordingly, steps are formed on both side surfaces of the FPC 100C. Thus, effects similar to those of the FPC 100A shown in FIG. 4A are obtained. Note that a method for manufacturing the FPC 100C and a method for manufacturing a sealing structure for electronic equipment including the FPC 100C are similar to those of the first embodiment, and therefore, description thereof will be omitted.

Although not specifically shown in the figure, the electronic equipment sealing structure according to the present embodiment and the method for manufacturing the sealing structure are also applicable to an FPC having a multilayer structure in which films and lines are provided over many layers. In this case, a configuration in which the width of a center film in the thickness direction of the FPC is greater than the width of an end-side film in the thickness direction of the FPC may be employed. Moreover, a configuration in which the width of the film decreases with an increase in a distance from the center in the thickness direction of the FPC may be employed.

Third Embodiment

FIGS. 5A to 6B show the third embodiment of the present disclosure. In the present embodiment, a configuration different from that of the first embodiment in an FPC configuration will be described. Other configurations and features are the same as those of the first embodiment, and therefore, the same reference numerals are used to represent the same components and description thereof will be omitted as necessary.

FIGS. 5A to 6B are views of steps of manufacturing an electronic equipment sealing structure according to the third embodiment of the present disclosure. Note that FIGS. 5A to 6B show each member by schematic sectional views (equivalent to sectional views along the AA line in FIG. 1A).

Figure 5A:
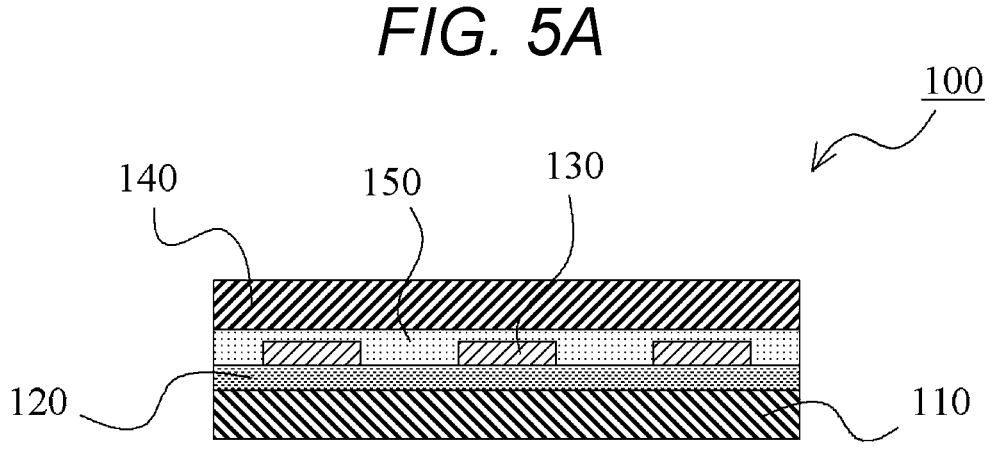
FIGS. 5A and 5B are views of steps of manufacturing an electronic equipment sealing structure according to a third embodiment of the present disclosure.
Figure 5B:
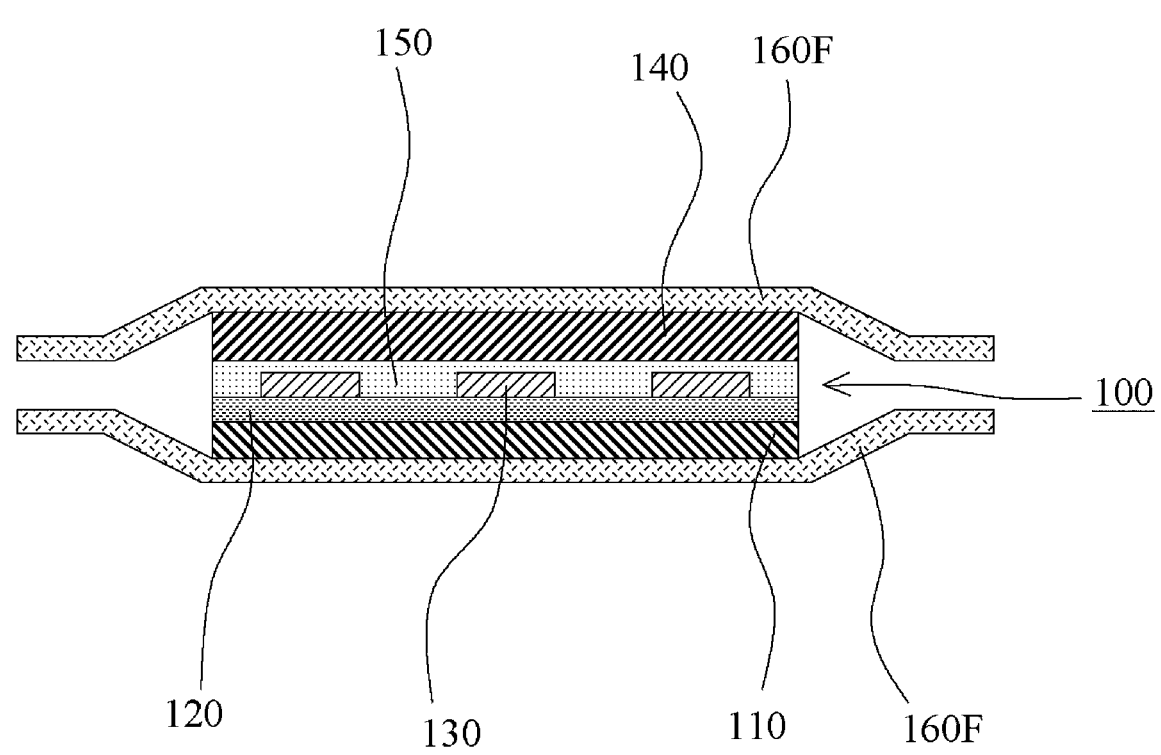
Figure 6A:
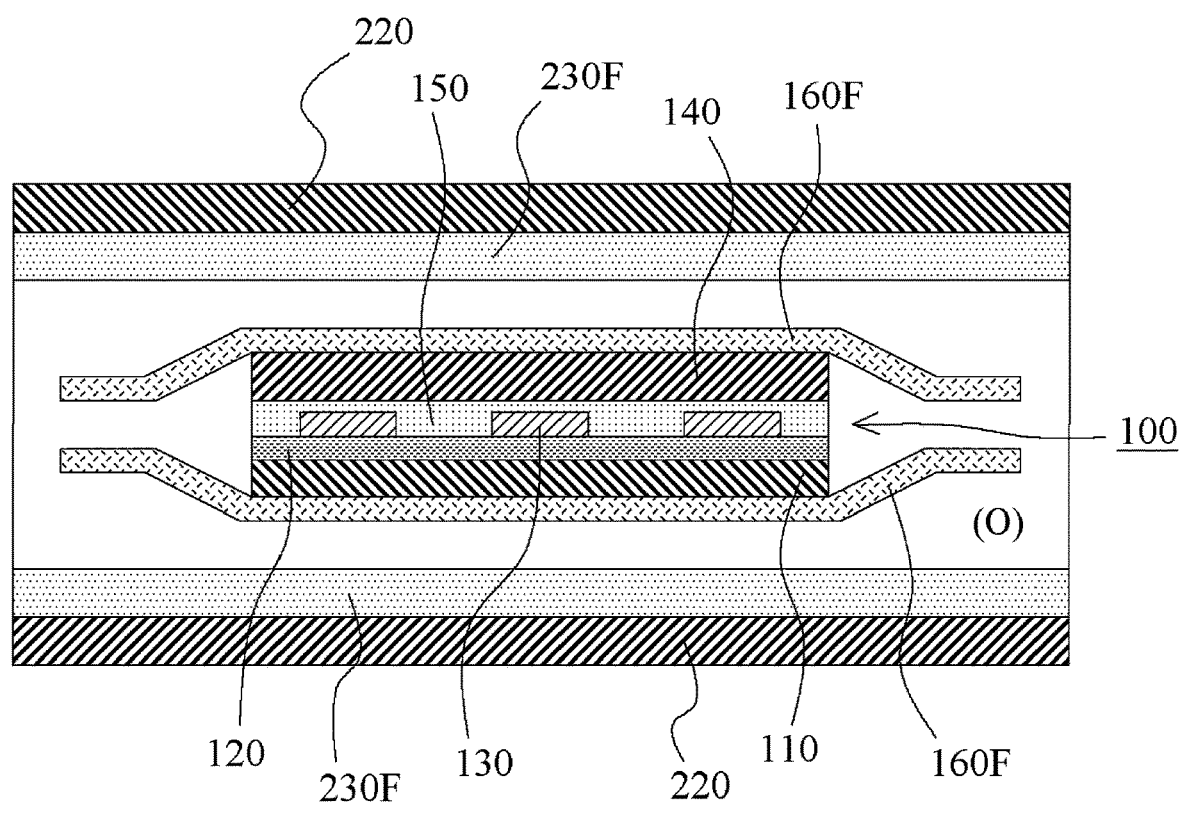
FIGS. 6A and 6B are views of the steps of manufacturing the electronic equipment sealing structure according to the third embodiment of the present disclosure.
Figure 6B:
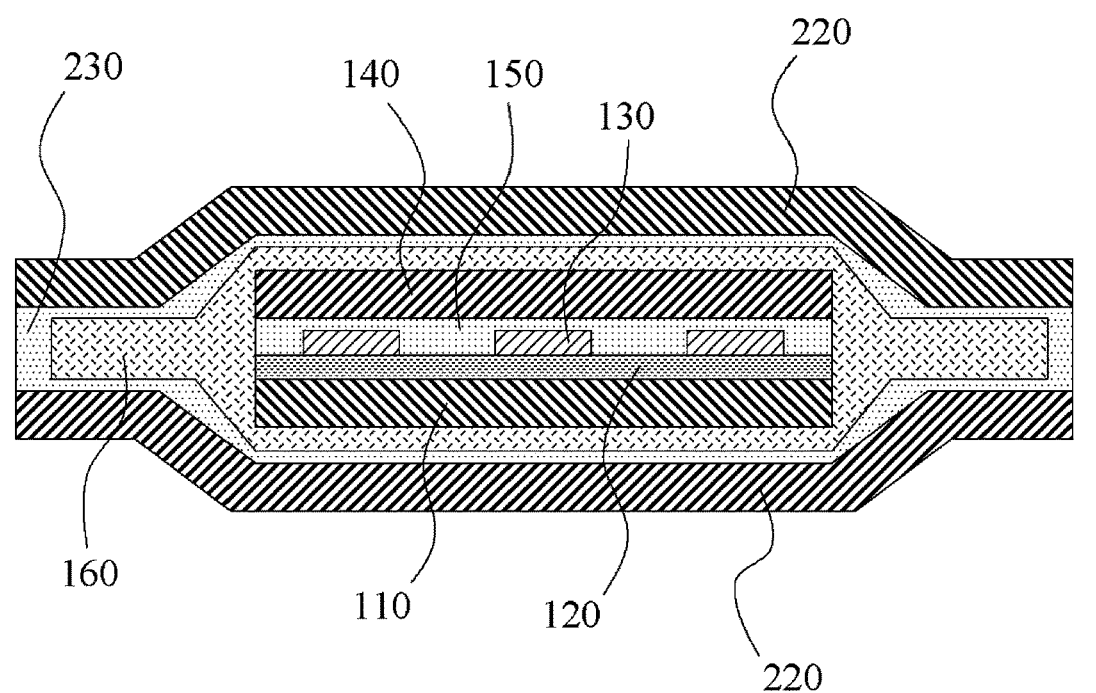

In the present embodiment, an FPC 100 is first manufactured (see FIG. 5A). A method for manufacturing the FPC 100 is as described in the first embodiment. Next, supplemental adhesive layers 160F are each provided on both surfaces of the FPC 100. The supplemental adhesive layers 160F are preferably provided on both surfaces of the FPC 100 so as to protrude to both sides of the FPC 100 in the short-side direction, i.e., protrude from both sides of the FPC 100 in the width direction (see FIG. 5B). As described above, the present embodiment is different from the first embodiment in that the supplemental adhesive layers 160F are provided in advance on both surfaces of the FPC 100. Thereafter, as in the first embodiment, the FPC 100 is arranged in a case 200 (see FIG. 6A), and adhering is performed with adhesive layers 230F provided inside a pair of thin plate portions 220 (see FIG. 6B). In this manner, the sealing structure is provided. The cured supplemental adhesive layer 160 is formed inside (side closer to the FPC 100)

the adhesive layer 230. Note that for a case 200, FIGS. 6A and 6B show only the pair of thin plate portions 220, but do not show a case body 210. In the present embodiment, a clearance between the inner wall surface of an opening O provided in the case 200 and the FPC 100 is closed with the cured supplemental adhesive layer 160 and adhesive layer 230.

As described above, in the present embodiment, in the state before adhering is performed with the adhesive layers 230F, the supplemental adhesive layers 160F are provided in advance on both surfaces of the FPC 100 so as to protrude to both sides of the FPC 100 in the short-side direction. Since the supplemental adhesive layers 160F are provided as described above, generation of a portion not filled with the adhesive layer 230 in the vicinity of the center of the FPC 100 in the thickness direction thereof can be reduced.

Note that the electronic equipment sealing structure according to the present embodiment and the method for manufacturing the sealing structure are also applicable to a configuration in which lines 130 and cover films 140 are provided on both surfaces of a base film 110 (so-called double-sided FPC) or an FPC having a multilayer structure in which films and lines are provided over many layers. That is, in the cases of the double-sided FPC and the FPC with the multilayer structure, supplemental adhesive layers 160F may be provided on outermost films as described above.

The present disclosure includes the following contents.

(1) An electronic equipment sealing structure for closing a clearance between the inner wall surface of an opening provided in a case and a flexible printed circuit board used with part of the flexible printed circuit board drawn out of the case through the opening, in which the case includes a pair of thin plate portions having flexibility and provided along the opening so as to face both surfaces of the flexible printed circuit board, and adhesive layers are provided in advance on the inner surfaces of the pair of thin plate portions, and the clearance is closed by adhering with the adhesive layers inside the pair of thin plate portions in a state of the flexible printed circuit board being arranged.

(2) The electronic equipment sealing structure according to (1), in which the flexible printed circuit board includes a base film, a line provided on the base film, and a cover film adhered to the base film so as to cover the line, and at least in a region where adhering is performed with the adhesive layers, the widths of the base film and the cover film in a short-side direction are different from each other.

(3) The electronic equipment sealing structure according to (2), in which the line and the cover film are provided on each surface side of the base film.

(4) The electronic equipment sealing structure according to any one of (1) to (3), in which a supplemental adhesive layer is provided in advance on each surface of the flexible printed circuit board so as to protrude to each side of the flexible printed circuit board in the short-side direction in a state before adhering with the adhesive layers being performed.

(5) A method for manufacturing an electronic equipment sealing structure for closing a clearance between the inner wall surface of an opening provided in a case and a flexible printed circuit board used with part of the flexible printed circuit board drawn out of the case through the opening, which includes a step of providing, in the case, a pair of thin plate portions having flexibility along the opening such that the thin plate portions face both surfaces of the flexible printed circuit board and providing adhesive layers on the inner surfaces of the pair of thin plate portions, a step of arranging the flexible printed circuit board in the case, and a step of performing adhering with the adhesive layers provided inside the pair of thin plate portions.

(6) The method for manufacturing the electronic equipment sealing structure according to (5), which further includes a step of manufacturing the flexible printed circuit board using a base film and a cover film whose widths in a short-side direction are different from each other at least in a region where adhering is performed with the adhesive layers.

(7) The method for manufacturing the electronic equipment sealing structure according to (6), in which the flexible printed circuit board is manufactured such that the line and the cover film are provided on each surface side of the base film.

(8) The method for manufacturing the electronic equipment sealing structure according to any one of (5) to (7), in which a supplemental adhesive layer is provided on each surface of the flexible printed circuit board so as to protrude to each side of the flexible printed circuit board in the short-side direction, and thereafter, the flexible printed circuit board is arranged in the case.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. An electronic equipment sealing structure comprising:
a case;
a flexible printed circuit board; and
an adhesive layer,
wherein the case includes a case body, an opening provided in the case body, and a pair of thin plate portions having flexibility,
part of the flexible printed circuit board is inserted into the case body through the opening,
one thin plate portion and the other thin plate portion of the pair of thin plate portions are provided along the opening so as to face first and second surfaces of the flexible printed circuit board, and
the adhesive layer is provided so as to close a clearance between an inner wall surface of the opening and the flexible printed circuit board.

2. The electronic equipment sealing structure according to claim 1, wherein
the flexible printed circuit board includes
a base film,
a line provided on the base film, and
a cover film adhered to the base film so as to cover the line, and
a width of the base film and a width of the cover film are different from each other.

3. The electronic equipment sealing structure according to claim 2, wherein
the line and the cover film are provided on each of first and second surface sides of the base film.

4. The electronic equipment sealing structure according to claim 1, further comprising:
a supplemental adhesive layer,
wherein the supplemental adhesive layer is provided inside the adhesive layer so as to cover each of the first and second surfaces of the flexible printed circuit board and protrude from each side surface of the flexible printed circuit board in a short-side direction of the flexible printed circuit board.

5. A method for manufacturing an electronic equipment sealing structure, comprising:
providing an opening in a case;
providing a pair of thin plate portions having flexibility along the opening such that one thin plate portion and the other thin plate portion of the pair of thin plate portions face each of first and second surfaces of a flexible printed circuit board to be inserted into the case through the opening;
providing an adhesive layer on each of inner surfaces of the one thin plate portion and the other thin plate portion;
inserting part of the flexible printed circuit board into the case through the opening; and
performing adhering with the adhesive layer.

6. The method for manufacturing the electronic equipment sealing structure according to claim 5, wherein
the flexible printed circuit board includes
a base film,
a line provided on the base film, and
a cover film adhered to the base film so as to cover the line, and
a width of the base film and a width of the cover film are different from each other.

7. The method for manufacturing the electronic equipment sealing structure according to claim 6, wherein
the line and the cover film are provided on each of first and second surface sides of the base film.

8. The method for manufacturing the electronic equipment sealing structure according to claim 5, further comprising:
before the inserting the part of the flexible printed circuit board into the case through the opening, providing a supplemental adhesive layer such that the supplemental adhesive layer covers the first and second surfaces of the flexible printed circuit board and protrudes from each side surface of the flexible printed circuit board in a short-side direction of the flexible printed circuit board.

* * * * *